United States Patent
Liu et al.

(10) Patent No.: US 6,638,867 B2
(45) Date of Patent: Oct. 28, 2003

(54) METHOD FOR FORMING A TOP INTERCONNECTION LEVEL AND BONDING PADS ON AN INTEGRATED CIRCUIT CHIP

(75) Inventors: Meng-Chang Liu, Chia-yi (TW); Yuan-Lung Liu, Yuan-Lin (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 123 days.

(21) Appl. No.: 10/029,624

(22) Filed: Dec. 31, 2001

(65) Prior Publication Data

US 2002/0055248 A1 May 9, 2002

Related U.S. Application Data

(62) Division of application No. 09/261,680, filed on Mar. 3, 1999, now Pat. No. 6,358,831.

(51) Int. Cl.[7] .................................... H01L 21/302
(52) U.S. Cl. ........................................... 438/692
(58) Field of Search ........................ 438/612, 634, 438/636, 637, 691–693, 706, 717, 720; 216/72, 67, 77

(56) References Cited

U.S. PATENT DOCUMENTS

| | | | |
|---|---|---|---|
| 5,219,787 A | 6/1993 | Carey et al. | 437/187 |
| 5,598,027 A | 1/1997 | Matsuura | 257/635 |
| 5,702,568 A | * 12/1997 | Shin et al. | 438/632 |
| 5,854,127 A | * 12/1998 | Pan | 438/629 |
| 5,930,664 A | * 7/1999 | Hsu et al. | 438/612 |
| 5,989,992 A | * 11/1999 | Yabu et al. | 438/612 |
| 6,261,939 B1 | * 7/2001 | Skala et al. | 438/612 |

OTHER PUBLICATIONS

Chang et al., "ULSI Technology", The McGraw–Hill Companies, Inc. ,NY 1996 , pp. 444–445.
El–Kareh, "Fundamentals of Semiconductor Processing Technologies", Kluwer Academic Publishers, Boston (1995), pp. 563–564.

* cited by examiner

*Primary Examiner*—Robert Kunemund
*Assistant Examiner*—Duy-Vu Deo
(74) *Attorney, Agent, or Firm*—George O. Saile; Stephen B. Ackerman

(57) ABSTRACT

A method for forming a top interconnection level and bonding pads for an integrated circuit chip is described. The interconnection level is formed by a damascene type process. Bonding pads are placed above the plane of the wiring channels of the interconnection level. This eliminates the problem of dishing of the relatively large bonding pads which occurs, during chemical mechanical polishing, when the bonding pads are on the same level as the interconnection metallurgy. The interconnection wiring includes a smaller pad base segment upon which the larger bonding pad is then formed. The bonding pad base segments are small enough that dishing during CMP is not a problem. Placing the bonding pads on pad bases provides for a more robust pad. The top level and bonding pad fabrication procedures are applicable with various conductive materials including aluminum, tungsten, and copper.

16 Claims, 7 Drawing Sheets

METHOD FOR FORMING A TOP INTERCONNECTION LEVEL AND BONDING PADS ON AN INTEGRATED CIRCUIT CHIP

This is a division of patent application Ser. No. 09/261, 680, filing date Mar. 3, 1999 U.S. Pat. No. 6,358,831, A Method For Forming A Top Interconnect Level And Bonding Pads On An Integrated Circuit Chip, assigned to the same assignee as the present invention.

BACKGROUND OF THE INVENTION

1. Field of the Invention

The invention relates to processes for the manufacture of semiconductor devices and more particularly to the formation of terminal metal layers and bonding pads.

2. Background of the Invention and Description of Prior Art

Integrated circuits are manufactured by forming discrete semiconductor devices in the surface of silicon wafers. A multi-level metallurgical interconnection network is then formed over the devices, contacting their active elements, and wiring them together to create the desired circuits. The wiring layers are formed by depositing an insulating layer over the discrete devices, patterning and etching contact openings into this layer, and then depositing conductive material into the openings. A conductive layer is applied over the insulating layer and patterned to form wiring interconnections between the device contacts, thereby creating a first level of basic circuitry. The circuits are then further interconnected by utilizing additional wiring levels laid out over additional insulating layers with conductive via pass throughs.

Depending upon the complexity of the overall integrated circuit, several levels of wiring interconnections are used. On the uppermost level the wiring is terminated at metal pads to which the chip's external wiring connections are bonded. These bonding pads are generally large in size compared to the interconnection wiring lines, typically measuring larger than about 50×50 microns.

A method for forming the uppermost or top interconnection layer is the damascene process, whereby openings and trenches, comprising an image of the interconnection pattern are formed in an insulative layer. A metal layer is then deposited into the openings and over the insulative layer. Finally, the metal is polished back to the insulative layer leaving the metal pattern inlaid within the insulative layer. Polishing back of the metal layer is accomplished by CMP (chemical mechanical polishing), a relatively old process which has found new application in planarization of insulative layers and more recently in the damascene process. In a single damascene process a metal line pattern is generated which connects to subjacent vias or contacts. In a dual damascene process, both vias and contacts and an interconnection stripe pattern are formed by a single metal deposition and CMP. A description of both single and dual damascene processes may be found in Chang, C. Y. and Sze, S. M., "ULSI Technology" McGraw-Hill, New York, (1996), p444–445 and in El-Kareh, B., "Fundamentals of Semiconductor Processing Technologies", Kluwer, Boston(1995), p563–4.

Carey, et.al., U.S. Pat. No. 5,219,787 shows a method for forming vias and wiring lines in a polyimide base by first forming a trench and via pattern in polyimide layers, depositing a copper seed layer, and then plating copper. The copper is polished back to the polyimide leaving metallization in the trenches and vias. Matsuura, U.S. Pat. No. 5,598,027 cites a metal deposition/polish back (damascene) method for forming interconnection layers using dry etching to form grooves in the insulating layers. After the interconnection material is deposited, the surface is polished back by CMP leaving the conductive pattern in the grooves.

The metal wiring layers, typically of an aluminum alloy or of an aluminum alloy containing copper and silicon, are deposited by sputtering or by vacuum evaporation. In the damascene process, copper metallization may also be used. The final metal interconnection layer includes the bonding pads which are typically located in the periphery of the integrated circuit. When large area features, such as bonding pads, are included in a damascene processed wiring pattern, a problem of bonding pad dishing arises when the metal is polished back to the insulative layer. Referring to FIG. 1 there is shown a planar view of a portion of the top metallization level of an integrated circuit on a wafer 20. A bonding pad 24 and wiring lines 26 lie embedded in an insulating layer 22. FIG. 1 is not drawn to scale the pad 24 is of the order of 50 by 50 microns square or larger and the wiring lines 26 are only of the order one micron or less in breadth.

A cross section of the region on wafer 20 indicated by the line 2–2' is shown in FIG. 2A at the point in the process after a metal layer 25 has been deposited onto the patterned insulative layer 22. The wide portion of metal 24 in the insulator is to become a bonding pad. When the substrate wafer is polished by CMP, the surfaces of the wide metal bonding pads tend to become dished as illustrated by the curvature 28 in FIG. 2B.

The dishing weakens the pad, by creating a thin central region. A subsequently attached wire bond will not only be weak mechanically, but also excessively resistive. A passivation layer 29 is applied over the layer 22 and the metal pattern. The passivation layer 29 seals the interconnection metallization on the wafer from contaminants and moisture, and also serves as a scratch protection layer. The passivation layer 29 typically consists of a layer of silicon nitride or a composite layer of phosphosilicate glass (PSG) over silicon oxide. The layer 29 is deposited by plasma enhanced chemical vapor deposition (PECVD). An opening 28 to the bonding pad is patterned and etched in the passivation layer 29 by a plasma etching process.

Weakening of the bonding pad caused by the CMP dishing is reflected by high yield losses at wafer acceptance testing(WAT) and at subsequent package stress testing. These yield losses also forewarn a reliability degradation. Dummy pads are sometimes added on the interconnection level to counteract CMP dishing. These pads are sacrificial and are not connected to interconnection lines. This awkward fix also lowers the integrity of the interconnection lines.

An alternative method for forming the top interconnection layer, including the bonding pads is to deposit and pattern the metal layer on the un-patterned surface of the insulative layer 22. The passivation layer is then deposited over the metal pattern. This is an older method, a predecessor of the damascene method, and is not favorably compatible with current high density multilevel interconnection technology because it produces a higher resistance, and higher defect densities.

SUMMARY OF THE INVENTION

Accordingly, it is an object of this invention to provide a method for forming a top interconnection level of a multi-level integrated circuit including bonding pads.

It is another object of this invention to provide a method for forming a top interconnection level of a multilevel integrated circuit by a damascene process with bonding pads formed by an etch process.

It is yet another object of this invention to provide a method for forming a top interconnection level of a multilevel integrated circuit including conductive base segments for bonding pads by a damascene process.

It is still another object of this invention to provide a method for forming a top interconnection level of a multilevel integrated circuit wherein the bonding pads connected to the level are elevated above the level thereby reducing the impact of environmental or other external electrical disturbances on the interconnection level.

It is yet another object of this invention to provide a method for forming a top interconnection level of a multilevel integrated circuit without the occurrence of dishing of the bonding pads.

It is yet another object of this invention to eliminate the need for dummy bonding pads on a top interconnection level of a multilevel integrated circuit.

These objects are accomplished by first forming the necessary wiring channels of the top interconnection level by patterning trenches and vias in an insulative layer. Bonding pads are not patterned in this insulative layer but segments of interconnection lines which form bases for connecting bonding pads are included. The base segments may be simple terminations of the interconnection wiring or they may be oversized terminations having dimensions somewhat larger than the interconnection line width but much smaller than those of the bonding pads. The interconnection metallurgy is then deposited. In a first embodiment, the interconnection metallurgy is polished back to the insulative layer surface by CMP and a second metal layer is deposited. Bonding pads are then patterned in the second metal layer by plasma etching.

In a second embodiment, the deposited interconnection metallurgy is partially polished back by CMP to planarize the surface. Bonding pads are then patterned on the residual conductive layer and the layer is etched back to the insulative layer surface, leaving the bonding pads on the surface of the insulative layer, connected to the subjacent wiring level through the access openings. This method is limited to metallurgies which lend themselves to dry plasma etching such as aluminum, aluminum alloys, and tungsten. The bonding pads may then be formed of another metal such as aluminum or tungsten. An advantage of both embodiments is that the thickness of the bonding pads is independent of the thickness of the interconnection level.

A passivation layer is deposited over the exposed top interconnection level and bonding pads and patterned to form openings over the bonding pads. Bonding pads formed by the methods of the embodiments are robust and flat. Because the bonding pads lie above the top interconnection level the risk of wire bonding damage to the interconnection level is diminished.

DESCRIPTION OF THE PREFERRED EMBODIMENTS

Figure 1:
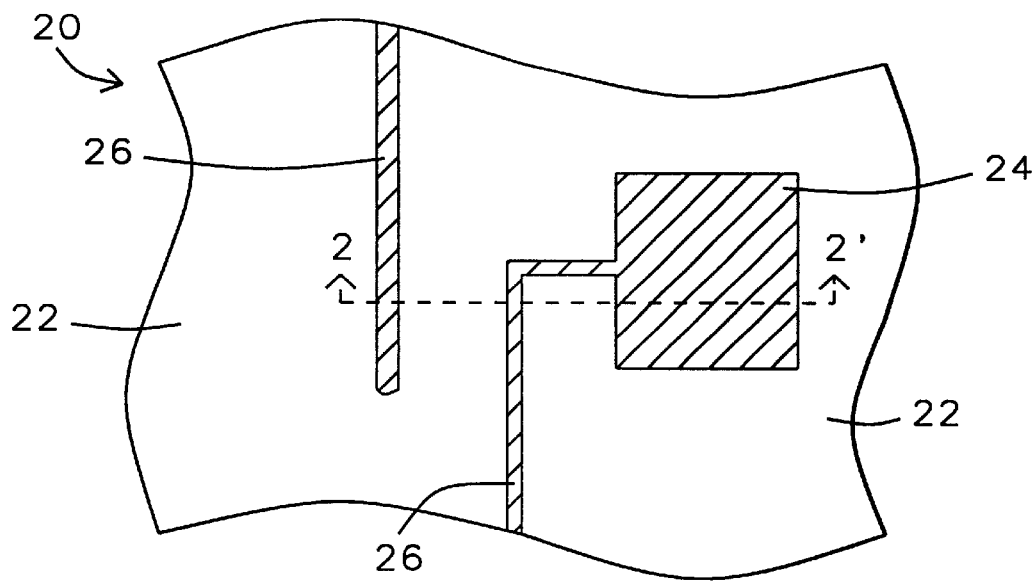
FIG. 1 is a planar view of a portion of a top interconnection level of a multilevel integrated circuit showing a bonding pad and wiring lines.
Figure 2A:
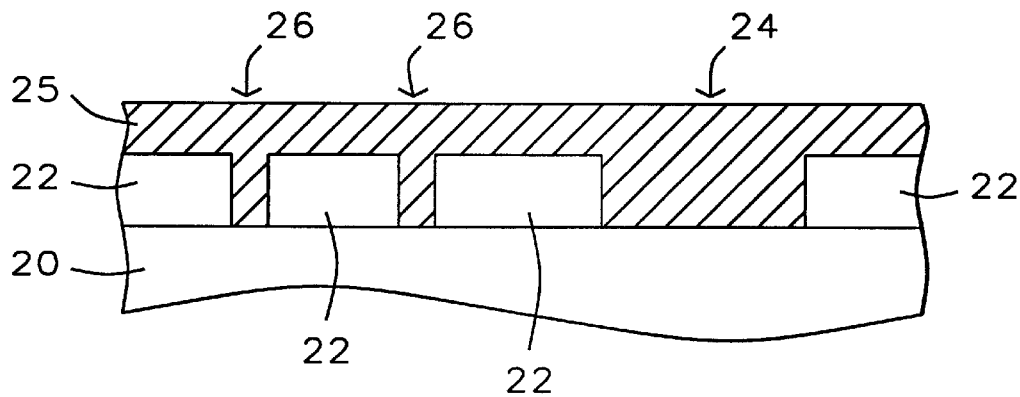
FIG. 2A is a cross section of a portion of a multilevel integrated circuit shown in FIG. 1 showing a metal layer deposited over an arrangement of vias and trenches patterned in an insulative layer.
Figure 2B:
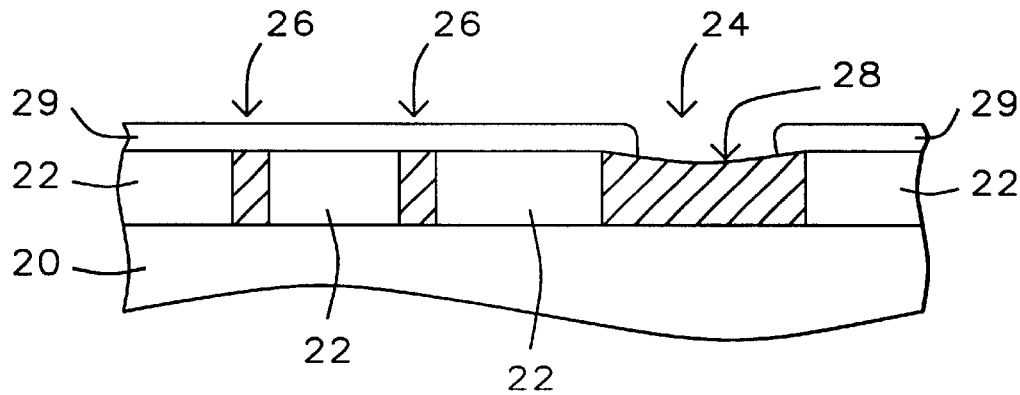
FIG. 2B is a cross section of a portion a multilevel integrated circuit showing the metal layer of FIG. 2, polished back by CMP and covered by a patterned passivation layer.
Figure 3:
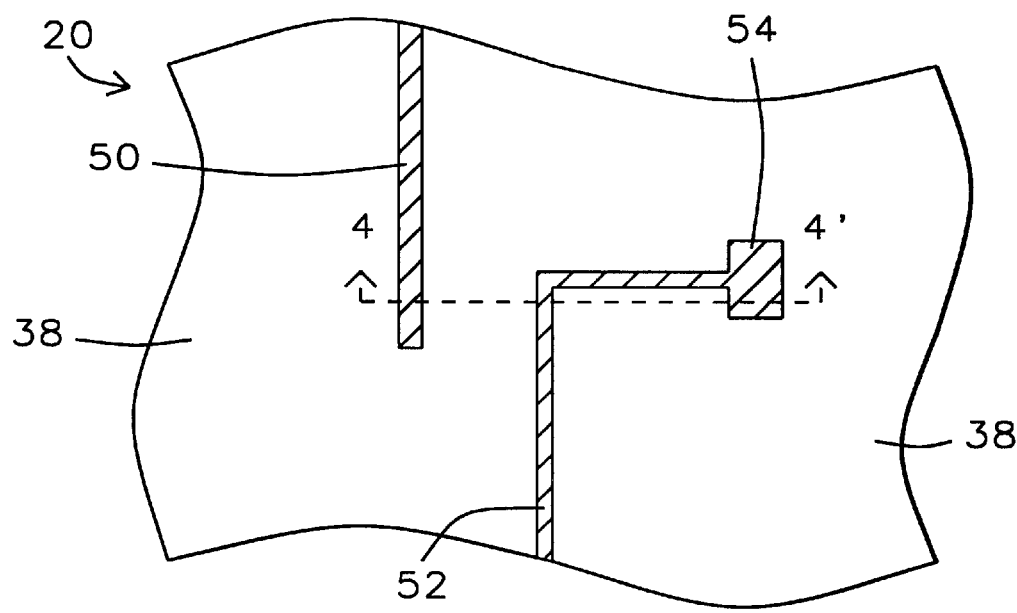
FIG. 3 is a planar view of a portion of a top interconnection level of a multilevel integrated circuit showing a bonding pad base and wiring lines formed by the process taught by the embodiments this invention.

In a first embodiment of this invention a top interconnection level is formed by metal deposition onto a insulative layer patterned with trenches. In addition to trenches for top level interconnection lines, the pattern in the insulative layer includes a bonding pad base segment at the termination of one of the interconnection lines. The metal layer is polished back to the insulative layer by CMP leaving a metal pattern inlay in the insulative layer. A planar view of a portion of the in the insulative layer with the inlaid metal pattern is shown in FIG. 3. Two processing paths will be described to form the inlaid metal pattern shown in FIG. 3. The first path will be using a single damascene process over an insulative layer with conductive vias. The second path will be a dual damascene process.

In FIG. 3 there is shown a line 50 which is a conductor of a top interconnection level on a substrate wafer 30. The conductive line 52 connects a portion of a subjacent integrated circuit to a bonding pad base segment 54 and is inlaid in an insulative layer 38. In FIG. 3 a bonding pad base segment 54 is shown at the termination of the conductive line 52 and is described thus in the embodiments. However, it is contemplated that the bonding pad base segment 54 may also be located at any position along the length of the conductive line 52 and thus be considered as a segment of the conductive line 52. The bonding pad base segment 54 described in the embodiments is rectangular and between about 1 and 10 microns wide and between about 1 and 10 microns long, the length being understood to be along the linear direction of the conductive line. The conductive lines 50, 52 are between about 0.2 and 2.0 microns wide. The bonding pad base segment 54 may be of the same width as or wider than the conductive line 52. In FIGS. 3, 6, and 7 the pad base segment 54 is shown wider than the conductive lines 50, 52. However, it is contemplated in this invention, that the width of the bonding pad base segment 54 may be comparable to the width of the conductive line 52.

Figure 4A:
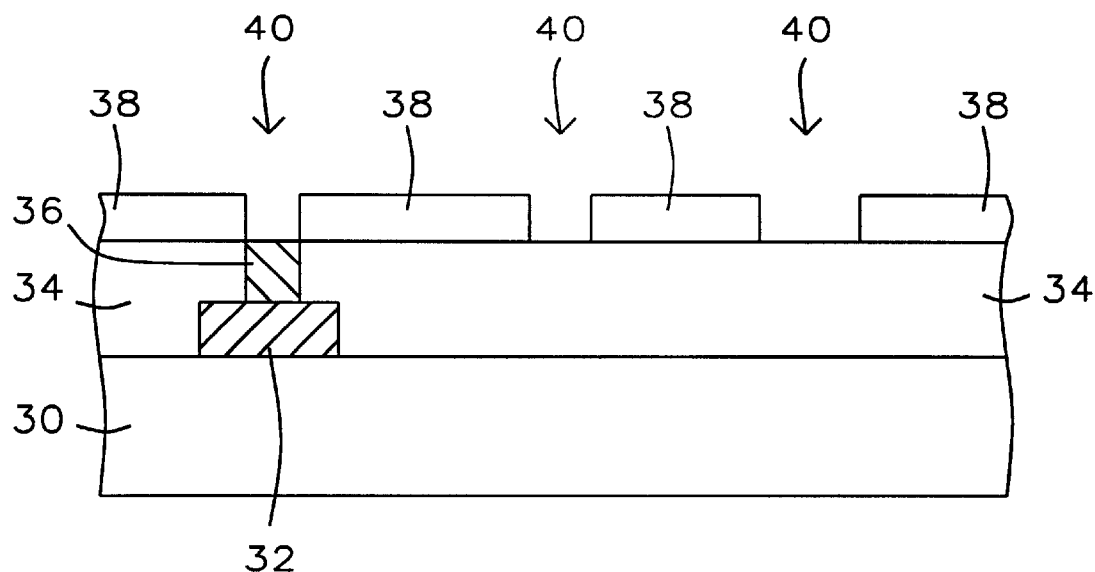
FIG. 4A and FIG. 4B are cross sections used to illustrate a first sequence of processing steps leading to the formation of a conductive layer from which a top interconnection level for an integrated circuit is to be formed by the embodiments of the current invention.

Referring to the cross section shown in FIG. 4A, a silicon wafer substrate 30 is provided. Integrated circuit devices(not shown) are formed in the of the silicon wafer substrate using conventional state of the art process technology. A plurality of interconnection levels are formed over the wafer 30 separated by insulative layers and interconnected through contacts and vias using integrated circuit processes well known by those skilled in the art. These layers and interconnection levels are not shown in the figures and are understood to be included in the substrate 30. The upper surface of substrate 30 is insulative and a metal interconnective stripe 32 is formed over the insulative surface. The metal interconnective stripe 32 is a portion of the uppermost of the plurality of interconnection levels, is patterned by conventional methods, and is between about 0.3 and 0.7 microns thick.

Figure 4B:
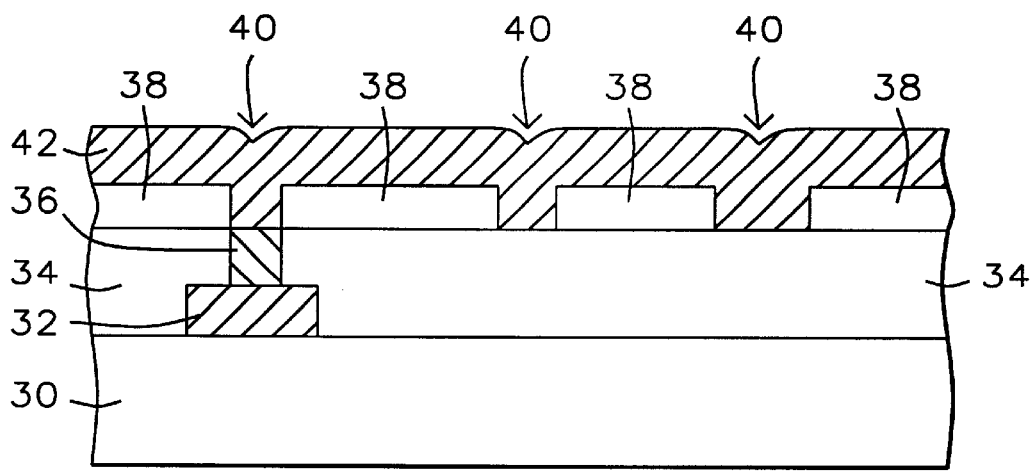

An insulative layer 34 is formed over the metal stripe 32 and a conductive via 36 is formed in an opening in the insulative layer 34. The insulative layer 34 is deposited to a thickness of between about 0.8 and 1.5 microns. Methods for depositing insulative layers and forming conductive vias are well known in the art. An insulative layer 38 is next deposited over the insulative layer 34, preferably by PECVD, and a pattern of trenches 40 is etched in the insulative layer 38, by plasma etching. The trench pattern is an image of the metal pattern shown in FIG. 3. The insulative layer 38 is between about 0.3 and 1.0 microns thick. The via 36 is exposed by the etching. Referring now to FIG. 4B, a conductive layer 42 is deposited over the wafer 30. The conductive layer 42 used in the embodiment is an aluminum alloy and is between about 4,000 and 20,000 Angstroms. Alternately, other metals for example tungsten or copper, may be used.

Figure 5A:
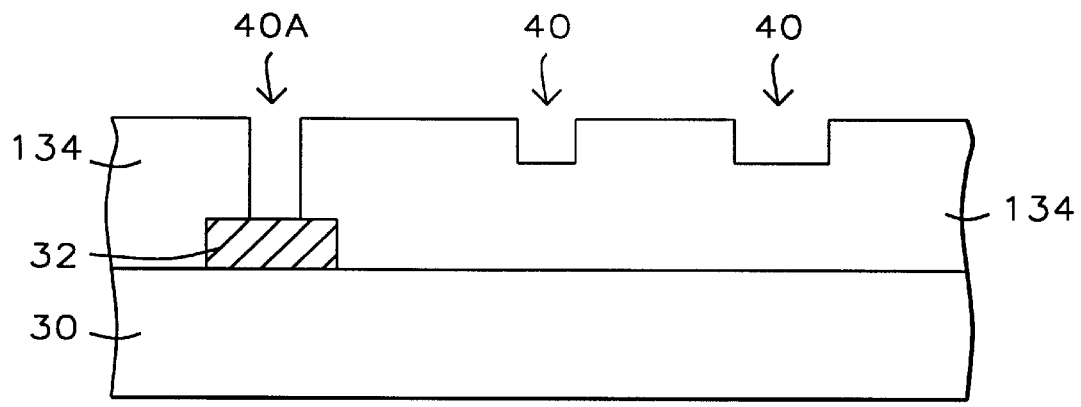
FIG. 5A and FIG. 5B are cross sections used to illustrate a second sequence of processing steps leading to the formation of a conductive layer from which a top interconnection level for an integrated circuit is to be formed by the embodiments of the current invention.

Alternatively, the configuration shown by the cross section of FIG. 4B may be formed by a dual damascene process which is now described. Referring to FIG. 5A a silicon wafer substrate 30 is provided. Integrated circuit devices(not shown) are formed on the silicon wafer substrate using conventional state of the art process technology. A plurality of interconnection levels are formed over the wafer 30 separated by insulative layers and interconnected through contacts and vias using integrated circuit processes well known by those skilled in the art. These layers and interconnection levels, not shown in the figures, are inferred to be included in the substrate 30. The upper surface of substrate 30 is insulative and a metal interconnective stripe 32 is formed over the insulative surface. The metal interconnective stripe 32 is a portion of the uppermost of the plurality of interconnection levels, is patterned by conventional methods, and is between about 0.3 and 0.7 microns thick.

An insulative layer 134 is formed over the metal stripe 32 by PECVD. The insulative layer 134 is between about 1.2 and 2.0 microns thick. Methods for depositing insulative layers and forming conductive vias are well known in the art. By dual masking and etching procedures, well known in dual damascene processing, a deep via 40A is formed over the metal line 32 and shallow trenches 40, 40A are formed to complete the interconnection pattern. The shallow trenches 40, 40A are between about 0.3 and 1.2 microns deep.

Figure 5B:
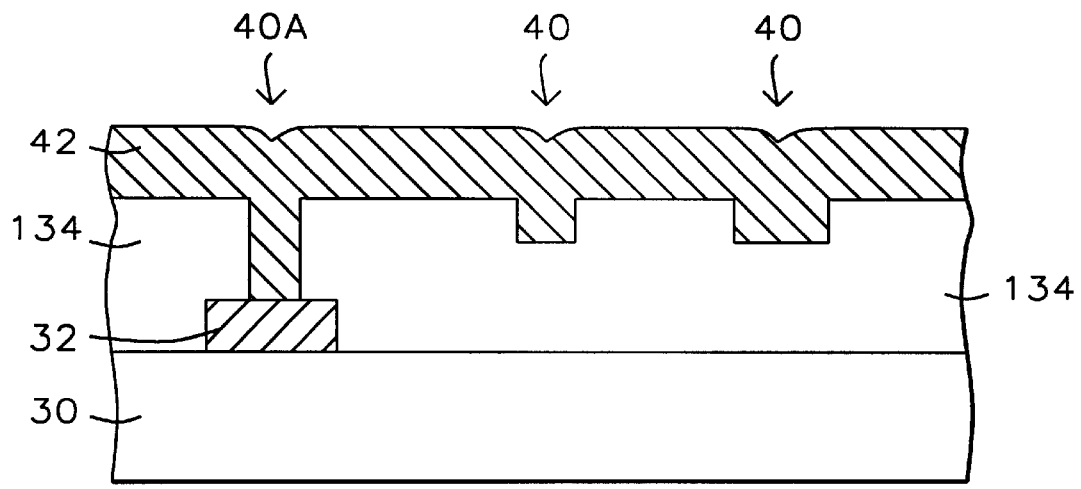

Referring to FIG. 5B, a conductive layer 42 is deposited over the wafer 30. The conductive layer 42 used in the embodiment is an aluminum alloy and is between about 4,000 and 20,000 Angstroms thick. Alternately, other metals for example tungsten or copper, may be used. The conductive layer 42 fills the deep via 40A as well as the shallow interconnection lines 40. The configuration achieved by the single damascene process steps shown in FIG. 4B and that achieved by dual damascene processing steps shown in FIG. 5B are considered equivalent with respect to the subsequent processing steps of the embodiments of this invention. The configuration resulting from the dual damascene process (FIG. 5B) will be used to describe the remainder of the processing steps of the current embodiment, although the configuration shown in FIG. 4B may alternatively be used. The cross sections of FIG. 4B, 5B, and those in FIG. 6A through FIG. 6D are along the line 4–4' of the planar view shown in FIG. 3.

Figure 6A:
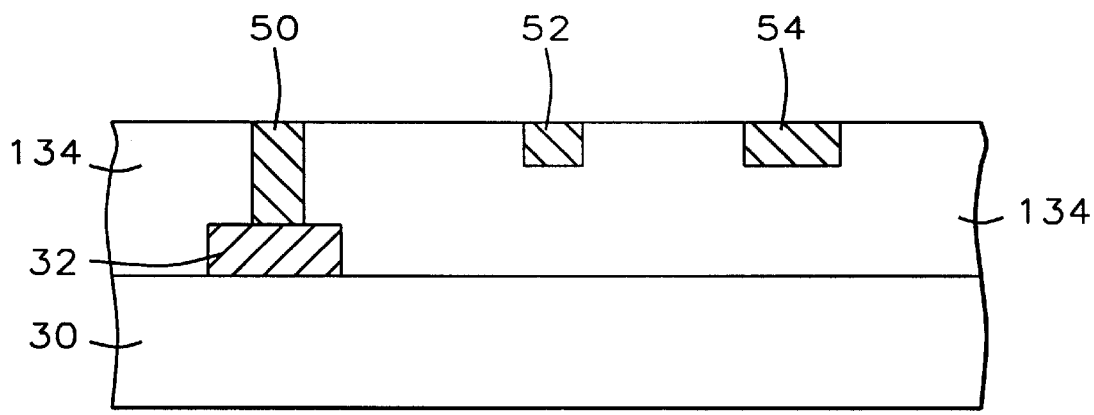
FIG. 6A through FIG. 6D are cross sections illustrating the sequence of processing steps leading to the formation a top interconnection wiring level with bonding pads according to a first embodiment of the current invention.

Referring to FIG. 6A, the conductive layer 42 is polished back by CMP to the surface of the insulative layer 134 leaving a metal pattern inlaid in the insulative layer 134. CMP is the preferred method, particularly if the layer 42 is copper or a copper alloy, Alternately, the conductive layer 42 may, be etched back to the surface of the insulative layer 134 by plasma etching. The metal features 50, 52, 54 are the cross sections of the corresponding the metal features in FIG. 3.

Figure 6B:
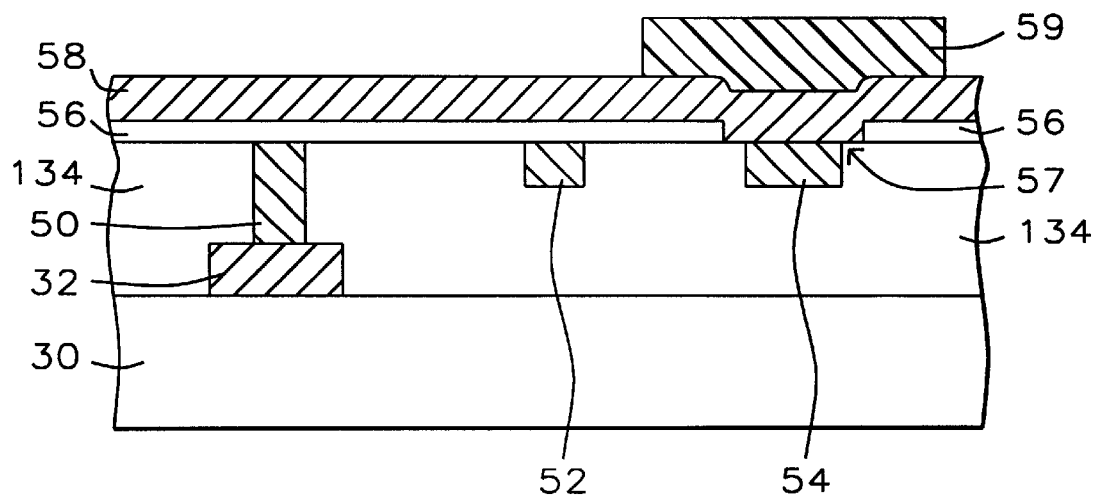

Referring to FIG. 6B a silicon oxide etch stop layer 56 is deposited over the insulative layer 134 and an opening 57 is patterned to exposed the bonding pad base segment 54. The etch stop layer 56 is between about 200 and 1,000 Angstroms thick and is deposited by PECVD. The patterning of the opening 57 is done using photoresist patterned by a block-out mask which does not require critical alignment. Alternately, the etch stop layer 56 may be formed of silicon nitride or of silicon oxynitride.

A conductive layer 58 is deposited over the etch stop layer 56. The conductive layer 58 is formed of aluminum and is between about 0.2 and 0.8 microns thick. Alternately the conductive layer 58 may be formed of another conductive material, for example, an aluminum alloy, tungsten, copper or a copper alloy. A photoresist layer 59 is deposited over the conductive layer 58 and patterned to protect a region of the conductive layer 58 which is to become a bonding pad.

Figure 6C:
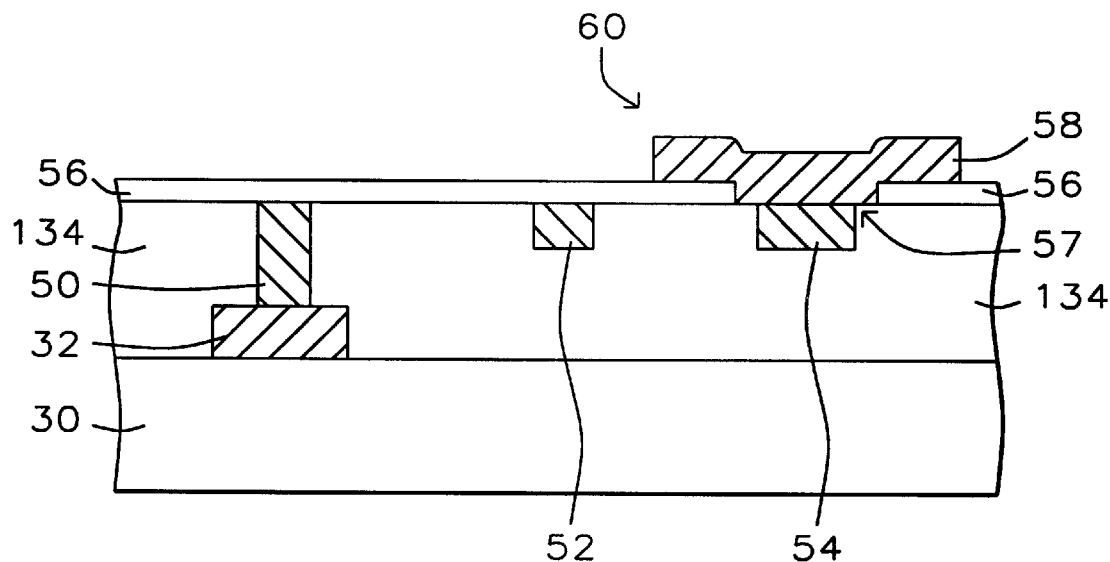

Referring next to FIG. 6C, the conductive layer 58 is etched, preferably by plasma etching. Methods and chemistries for etching aluminum and its alloys by a reactive plasma are well known to those in the art. Etchants containing chlorine or bromine are widely used. Alternately, if the conductive layer 58 comprises a metal such as copper, a wet etching procedure may be preferred for patterning, for example by nitric acid or by etchants containing ammonium or ammonium related ions. The dimensions of the bonding pad 60 are generally of the order of tens of microns and a slight amount of undercutting which occurs during wet etching will have negligible impact on the bonding pad integrity. In the current embodiment the bonding pad is rectangular and between about 40 and 100 microns on a side. The surface of the interconnection pattern is properly protected from the wet etch by the etch stop layer 56.

Figure 6D:
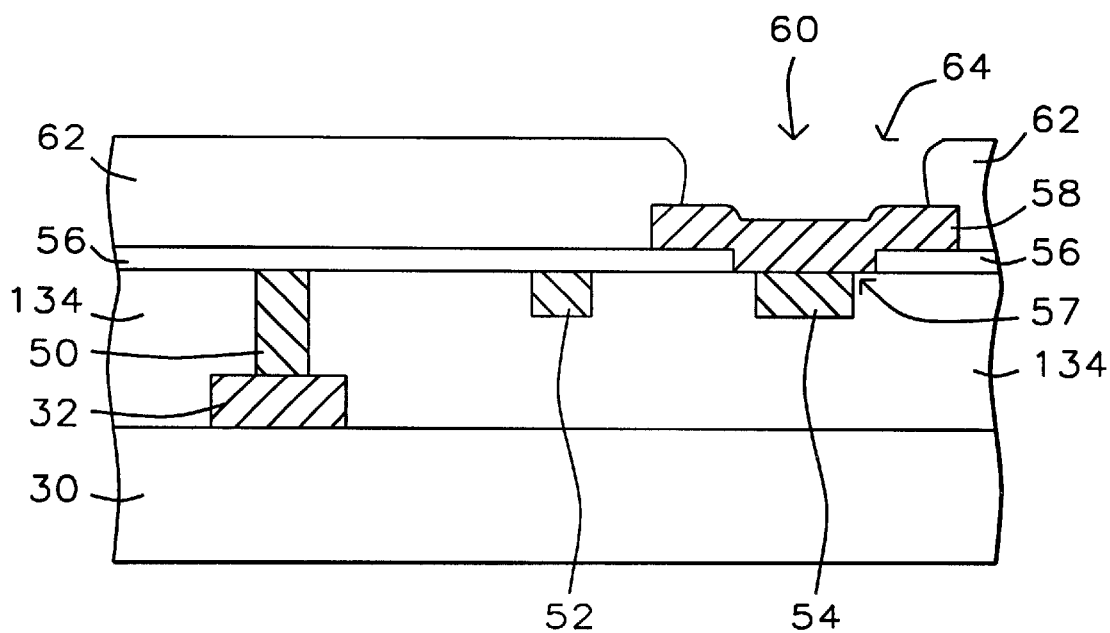

Referring to FIG. 6D, a passivation layer 62 is deposited over the wafer 30 and the bonding pad 60 is exposed by patterning and etching an opening 64 in the passivation layer 62. The passivation layer 62 is formed as a composite layer of a silicon nitride layer deposited over a silicon oxide layer. The depositions are made by PECVD using precursors and deposition parameters well known by those in the art. The passivation layer 62 is between about 1.0 and 2.0 microns thick. Alternatively a phosphosilicate glass(PSG) layer may be used in place of silicon nitride to form the upper portion of the passivation layer 62. In practice the passivation layer may be of any composition or form which provides a protective coating over the integrated circuit. The opening 64 is patterned with photoresist and etched by plasma etching using etchants and etching conditions well known to those in the art.

Figure 8:
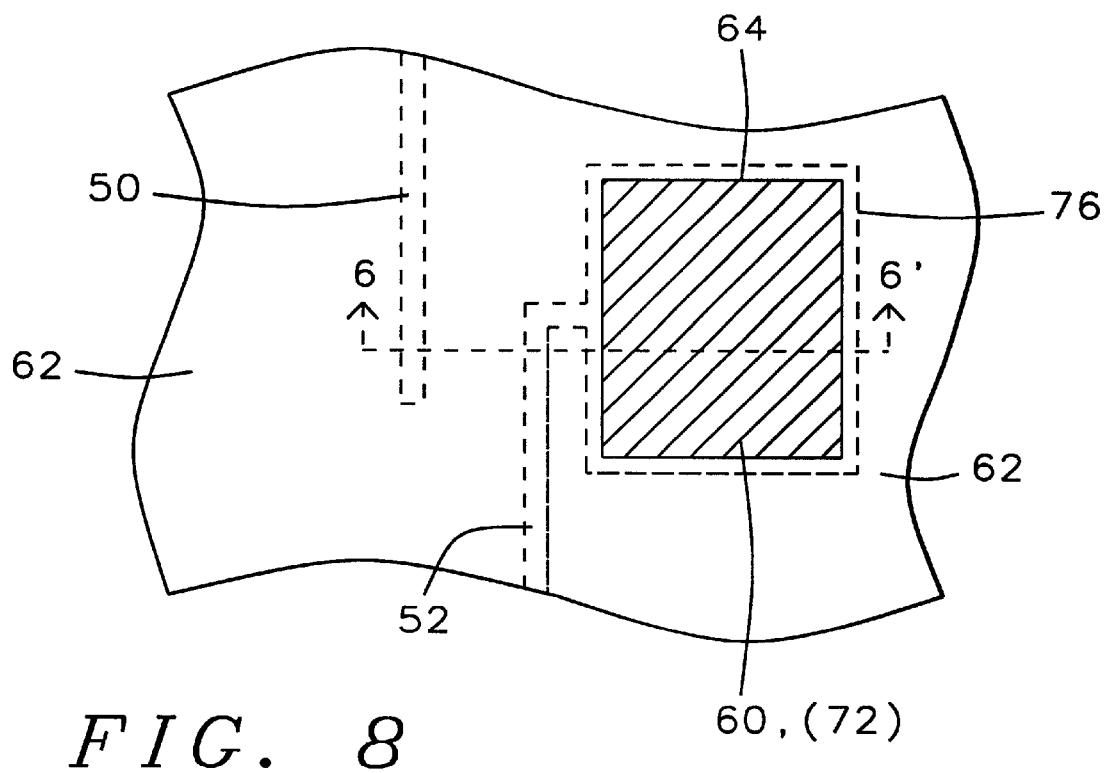
FIG. 8 is a planar view of a portion of a top interconnection level of a multilevel integrated circuit showing a bonding pad and wiring lines covered by a passivation layer formed according to the processes taught by this invention.

FIG. 8 shows a planar view of the completed structure. The dotted line 76 shows the bonding pad 60 extending beneath the passivation layer 62 at the edges of the opening 64. The interconnection lines 50, 52, beneath the passivation layer 62 are also shown as dotted lines. The cross sections shown in FIG. 6A through FIG. 6D are along the line 6–6' in FIG. 8.

In a second embodiment of this invention a top interconnection level is formed by metal deposition onto a patterned insulative layer. The metal layer is planarized by CMP but not polished entirely back to the insulative layer. Bonding pads are then patterned into the remaining metal layer by plasma etching. Finally a passivation layer is deposited and patterned to form openings to the bonding pads.

Figure 7A:
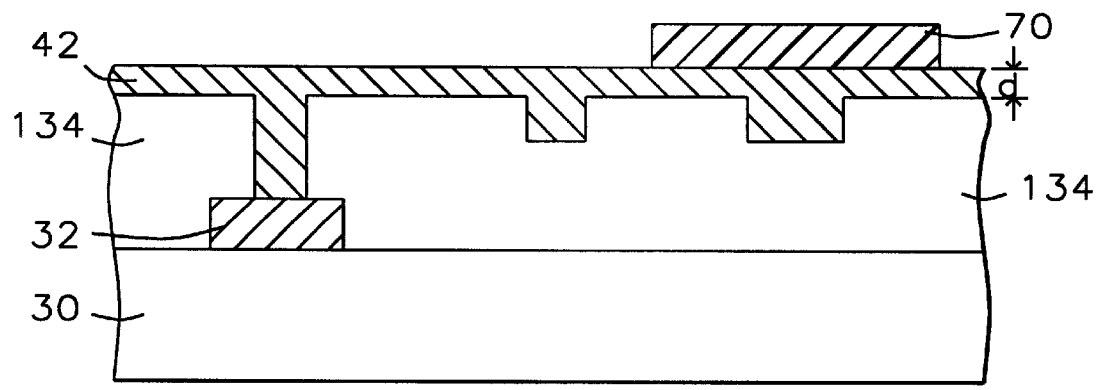
FIG. 7A through FIG. 7B are cross sections illustrating the sequence of processing steps leading to the formation a top interconnection wiring level with bonding pads according to a second embodiment of the current invention.
Figure 7B:
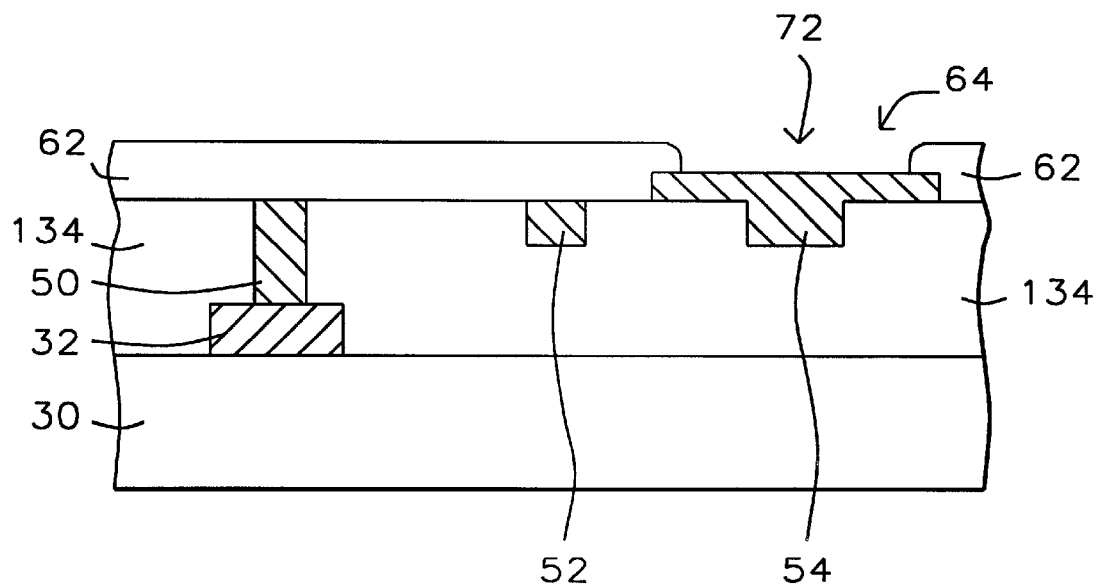

Referring to FIG. 7A a silicon wafer substrate 30 is provided. Integrated circuit devices(not shown) are formed in the surface of the silicon wafer substrate using conventional state of the art process technology. A plurality of interconnection levels are formed over the wafer 30 separated by insulative layers and interconnected through contacts and vias using integrated circuit processes well known by those skilled in the art. These layers and interconnection levels are not shown in the figures but are inferred to be included in the substrate 30. The upper surface of substrate 30 is insulative and a metal interconnective stripe 32 is formed over the insulative surface. The metal interconnective stripe 32 is a portion of the uppermost of the plurality of interconnection levels, is patterned by conventional methods, and is between about 0.3 and 0.7 microns thick. The wafer 30 is processed in the same manner as in the first embodiment to achieve the configuration shown in cross section by FIGS. 4B or 5B. The cross sections of FIG. 4B, 5B, and those in FIGS. 7A and 7B are all along the line 4–4' of the planar view shown in FIG. 3.

The configuration shown in FIG. 4B and that shown in FIG. 5B, achieved by dual masking and etching steps of a single insulative layer are considered equivalent with respect to the subsequent processing steps of the embodiments of this invention. The configuration resulting from the dual masking process (FIG. 5B) is used to describe the remainder of the processing steps of the current embodiment, although the configuration shown in FIG. 4B may alternatively be used. The conductive layer 42 used in this embodiment is an aluminum alloy. Alternately, other metals for example tungsten, copper, or alloys of aluminum or copper may be used. Conductive layer 42, as shown in FIG. 5B, has an as-deposited thickness of between about 4,000 and 20,000 Angstroms.

Referring now to FIG. 7A, conductive layer 42, which has been deposited on the patterned insulative layer 134, is planarized and polished to a thickness d of between about 0.2 and 0.8 microns by CMP. Photoresist 70 is deposited and patterned to protect a region of polished conductive layer 42 which is to become a bonding pad. Referring to FIG. 7B, Conductive layer 42 is etched by RIE or by plasma etching to expose the subjacent insulative layer 134. The photoresist 70 is stripped by either plasma ashing or by conventional resist strippers, leaving the completed bonding pad 72.

Although the second embodiment forms the bonding pad and the top interconnection level from a single conductive layer deposition, the use of an etch stop layer as exercised in the first embodiment is not permitted. It is therefore critical that excessive over etching is avoided in the conductive layer 42 etch which defines the bonding pad 72. A suitable etchant must therefore have a high selectivity of metal versus oxide. Such etchants are well known and can be tailored to achieve optimum selectivity. A preferred etchant is one containing $Cl_2$, $BCl_3$, and $CHF_3$ in an argon carrier gas. This etchant can achieve an etch rate selectivity of greater than 5:1.

A passivation layer 62 is deposited over the wafer 30 and the bonding pad 72 is exposed, for subsequent wire bonding, by patterning and etching an opening 64 in the passivation layer 62. The passivation layer 62, is formed as a composite layer of a silicon nitride layer deposited over a silicon oxide layer. The depositions are made by PECVD using precursors and deposition parameters well known by those in the art. The passivation layer 62 is between about 1.0 and 2.0 microns thick. Alternatively a phosphosilicate glass(PSG) layer may be used in place of silicon nitride to form the upper portion of the passivation layer 62. In practice the passivation layer may be of any composition or form which provides a protective coating over the integrated circuit. The opening 64 is patterned with photoresist and etched by plasma etching using etchants and etching conditions well known to those in the art.

FIG. 8 shows a plan view of the completed structure. The dotted line 76 shows the bonding pad 72 extending beneath the passivation layer 62 at the edges of the opening 64. The interconnection lines 50,52, beneath the passivation layer 62 are also shown as dotted lines. The cross sections shown in FIG. 7A and FIG. 7B are along the line 6–6' in FIG. 8.

While the invention has been particularly shown and described with reference to the preferred embodiments thereof, it will be understood by those skilled in the art that various changes in form and details may be made without departing from the spirit and scope of the invention.

What is claimed is:

1. A method for forming a bonding pad comprising:
   (a) providing a substrate with an insulative layer;
   (b) patterning a trench in said insulative layer;
   (c) depositing a layer of conductive material on said insulative layer;
   (d) polishing said layer of conductive material until a residual thickness of said layer of conductive material remains on the surface of said insulative layer;
   (e) patterning a layer of photoresist on said layer of conductive material to define a bonding pad over a segment of said trench; and
   (f) etching said layer of conductive material to expose the surface of said insulative layer thereby forming a conductive stripe in said trench and a bonding pad connected to said segment.

2. The method of claim 1 wherein said insulative layer is silicon oxide.

3. The method of claim 1 wherein said layer of conductive material is selected from the group consisting of aluminum, copper, tungsten, an aluminum alloy, and a copper alloy.

4. The method of claim 1 wherein said conductive stripe is between about 0.2 and 2.0 microns wide and said segment is rectangular having a length of between about 1 and 10 microns measured in the direction parallel to said conductive stripe, and a width of between about the width of said conductive stripe and 10 microns.

5. The method of claim 1 wherein said residual thickness of said layer of conductive material is between about 0.2 and 0.8 microns.

6. The method of claim 1 wherein said trench is between about 0.3 and 1.2 microns deep.

7. The method of claim 1 wherein said bonding pad is rectangular having length and width dimensions of between about 40 and 100 microns.

8. A method for forming a top interconnection level and bonding pads of an integrated circuit comprising:
   (a) providing a silicon wafer substrate having integrated circuit devices and a first interconnection level;
   (b) depositing an insulative layer;
   (c) forming trenches and via openings exposing elements of said first interconnection level in said insulative layer;
   (d) depositing a layer of conductive material on said insulative layer;
   (e) polishing said layer of conductive material until a residual thickness of said layer of conductive material remains on the surface of said insulative layer;
   (f) patterning a plurality of bonding pads in said residual thickness of said layer of conductive material, each one of said plurality of bonding pads lying over and contiguous with a segment of said conductive material in said trenches, thereby forming a second interconnection level containing conductive lines in said trenches with a plurality of segments to which superjacent bonding pads are attached;
   (g) depositing a passivation layer; and
   (h) patterning said passivation layer to form an access opening over each one of said plurality of bonding pads.

9. The method of claim 8 wherein said insulative layer is silicon oxide.

10. The method of claim 8 wherein said layer of conductive material is selected from the group consisting of aluminum, copper, tungsten, an aluminum alloy, and a copper alloy.

11. The method of claim 8 wherein said conductive lines are between about 0.2 and 2.0 microns wide and said segments are rectangular having a length of between about 1 and 10 microns measured in the direction parallel to the local linear direction of the conductive lines to which they abut and a width of between about the width of the conductive lines and 10 microns.

12. The method of claim 8 wherein said second layer of conductive material is selected from the group consisting of aluminum, copper, tungsten, an aluminum alloy, and a copper alloy.

13. The method of claim 8 wherein said residual thickness of said layer of conductive material is between about 0.2 and 0.8 microns.

14. The method of claim 8 wherein said trenches are between about 0.3 and 1.2 microns deep.

15. The method of claim 8 wherein said bonding pads are rectangular having length and width dimensions of between about 40 and 100 microns.

16. The method of claim 8 wherein said passivation layer is between about 1 and 2 microns thick.

* * * * *